United States Patent [19]

Satoh et al.

[11] Patent Number: 4,462,087
[45] Date of Patent: Jul. 24, 1984

[54] ION-IMPLANTED BUBBLE DEVICE

[75] Inventors: Yoshio Satoh, Yokohama; Makoto Ohashi, Kawasaki; Tsutomu Miyashita, Inagi; Kazuo Matsuda; Kazunari Komenou, both of Kawasaki, all of Japan

[73] Assignee: Fujitsu Limited, Kawsaki, Japan

[21] Appl. No.: 468,707

[22] Filed: Feb. 22, 1983

[30] Foreign Application Priority Data

Feb. 22, 1982 [JP] Japan ................. 57-25995
Apr. 28, 1982 [JP] Japan ................. 57-70204

[51] Int. Cl.³ .............................. G11C 19/08
[52] U.S. Cl. .............................. 365/36; 365/15
[58] Field of Search ..................... 365/15, 36

[56] References Cited

U.S. PATENT DOCUMENTS 4,386,418 5/1983 Ju ............................. 365/36
4,402,060 8/1983 Best et al. .................... 365/36
4,415,988 11/1983 Komenou et al. ............... 365/36

Primary Examiner—James W. Moffitt
Attorney, Agent, or Firm—Staas & Halsey

[57] ABSTRACT

Ion-implanted bubble device comprises a magnetic layer in which bubble propagation paths are formed by ion-implantation. The bubble propagation path has an inside turn including a cusp of which the summit deviates toward a direction of bubble propagation with respect to a cusp center line. Such a bubble propagation path permits the ion-implanted bubble device adopting a folded minor loop organization to be realized.

5 Claims, 24 Drawing Figures

Fig. 6 PRIOR ART
Fig. 7 PRIOR ART
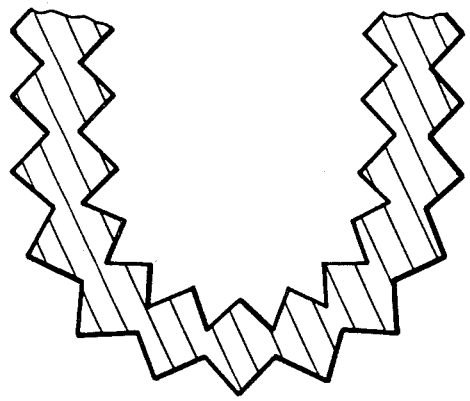
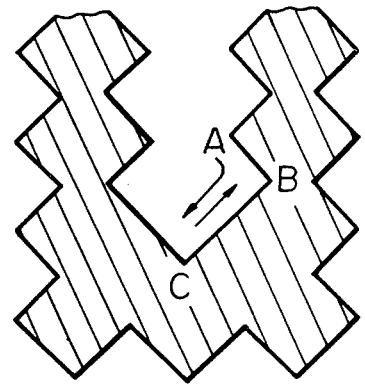
Fig. 8
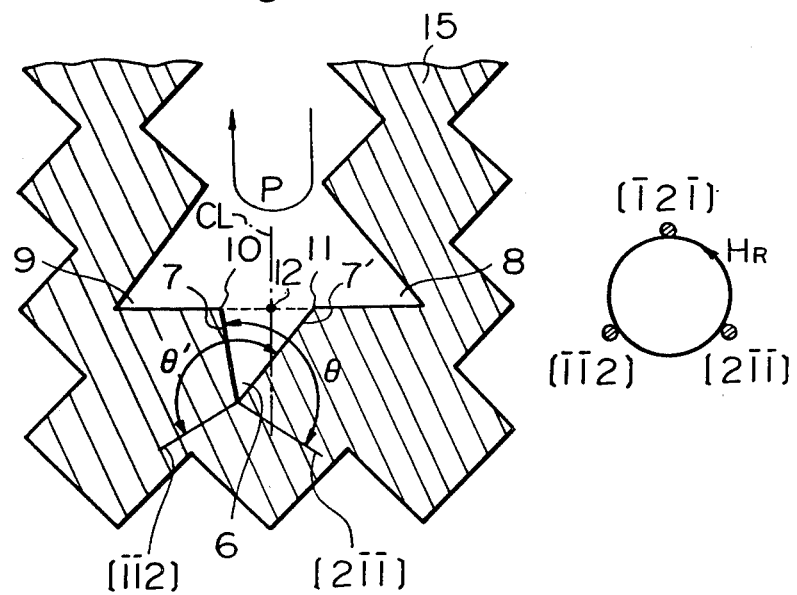

ION-IMPLANTED BUBBLE DEVICE

BACKGROUND OF THE INVENTION

The present invention relates to a magnetic bubble device and, more particularly, to bubble propagation paths of an ion-implanted bubble device in which the bubble propagation paths are made in a layer of magnetic material by ion-implantation.

In recent years, a number of approaches have been proposed for the realization of a high density storage magnetic bubble memory device in which the bit period is 4 μm or less, and the memory capacity is 4 Mbits or more. A very promising proposal is the ion-implanted bubble device which is well known in the art.

On the other hand, the most popular bubble propagation organization for the ion-implanted bubble device is a major-minor organization which comprises a plurality of minor loops and one or two major lines (or loops). The bubble is transferred by a transfer gate between the minor loop and the major line. However, the minor loop of prior art has a linear formation which is inconvenient from the viewpoint of design as well as performance of the transfer gate so far as a high density device is concerned. Such a formation of the minor loop also disadvantageously limits an improvement of the storage density.

To solve these problems, it is preferred to adopt the folded minor loop organization which has usually been employed in conventional permalloy bubble devices. In this folded minor loop organization, the loop has conventionally been folded, for example, in a U- or h-shaped. However, such folded minor loops must have, as will be described more in detail later, in addition to a plurality of 180° outside turns, at least one 180° inside turn along the bubble propagation path. No 180° inside turn of the bubble propagation path having good performance characteristics and requiring no large space has been realized by ion-implantation. Accordingly, it has been impossible to realize an ion-implanted bubble device adopting the folded minor loop organization.

SUMMARY OF THE INVENTION

It is, therefore, a principal object of the present invention to provide a bubble propagation path for the ion-implanted device that is improved to make possible the realization of the ion-implanted bubble device adopting the folded minor loop organization.

The bubble propagation path of the ion-implanted bubble device according to the present invention has a plurality of substantially U-shaped turns and is folded back toward a good track which is, in turn, parallel to an easy axis of striping out in a magnetic layer, each of said substantially U-shaped turns including at least one inside turn, said inside turn including at least one substantially V-shaped cusp, with tips being provided between the turn cusp and the neighboring cups on the bubble transfer-in and bubble transfer-out sides, respectively, summits of said turn cusp and said neighboring cusps being arranged so that these summits cannot be seen through from each other, and the summit of said turn cusp deviating toward a direction of bubble propagation with respect to a center line of this cusp extending in parallel to said easy axis of striping out and passing a middle point on a line connecting said tips.

The present invention will now be described in detail based on preferred embodiments and in contrast with the prior art, with reference to the accompanying drawings.

BRIEF DESCRIPTION OF THE DRAWINGS

FIG. 6 illustrates an embodiment of the turn in the conventional bubble propagation path;

FIG. 7 illustrates another embodiment of the turn in the conventional bubble propagation path;

FIG. 8 illustrates an embodiment of the turn in a bubble propagation path according to the present invention;

DETAILED DESCRIPTION OF THE PREFERRED EMBODIMENTS

First, the prior art will be described with reference to FIGS. 1 through 3.

Figure 1:
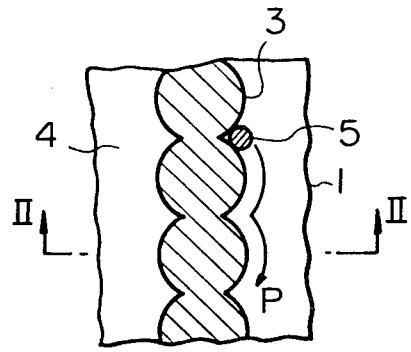
FIG. 1 is a partial plan view of an ion-implanted magnetic bubble propagation pattern.
Figure 2:
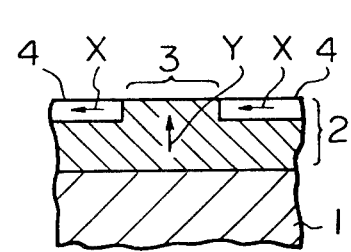
FIG. 2 is a sectional view taken along the line II—II in FIG. 1.

FIGS. 1 and 2 illustrate a bubble propagation pattern made by ion-implantation. The reference number 1 designates a substrate of gadolinium gallium garnet, on which a thin layer 2 of magnetic garnet is deposited by the method of liquid-phase epitaxial growth. The magnetic layer 2 has a first region 3, and a second remainder region 4 in which an ion, such as H, Ne or He is implanted. The second ion-implanted region 4 has an easy axis of magnetization in the plane of the layer 2 as shown by an arrow X, and the first nonimplanted region 3 has an easy axis of magnetization normal to the plane of the layer 2 as shown by an arrow Y. A bubble 5 is moved along the periphery of the first region 3 by means of a magnetic field rotating in the plane of the layer 2. Therefore, the first region 3 defines a bubble propagation pattern. Such a bubble propagation pattern as mentioned above is a contiguous pattern, which may be composed of a plurality of overlapping disks or square patterns and therefore requires no gap, unlike a conventional permalloy pattern. This fact makes it possible to relax the pattern in precision and, accordingly, to provide a smaller pattern and a higher density.

Figure 3:
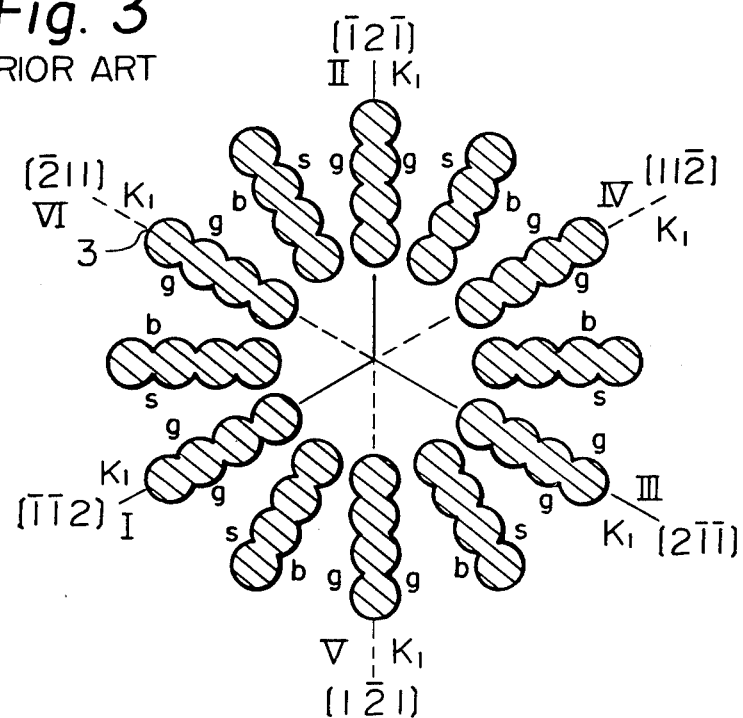
FIG. 3 illustrates the relationship between the easy axis of magnetization of the magnetic layer and the bubble propagation pattern.

In the magnetic layer 2, there are six easy axes of magnetization $K_1$ in the directions $(\bar{1}\bar{1}2)$, $(\bar{1}2\bar{1})$, $(2\bar{1}\bar{1})$, $(1 1 \bar{2})$, $(1 \bar{2} 1)$ and $(\bar{2} 1 1)$ which are 60° apart from each other, as illustrated in FIG. 3. These axes are classified into two groups: that is, a group including the axes I, II and III; and the other group including the axes IV, V and VI. The axes I, II and III are easy axes of stripe out.

Depending in which direction the patterns composing the bubble propagation pattern are linearly arranged, with respect to the easy axes of magnetization $K_1$, there are three kinds of bubble propagation path; that is, a super track "s", a bad track "b" and a good track "g". The super track "s" is a propagation path in which the bias field margin is large and the bubble can be easily propagated. The track "b" is a propagation path in which the bias field margin is small and the bubble cannot be easily propagated. The good track "g" is a propagation path in which the operating margin in the bubble propagation is moderate. As illustrated in FIG. 3, the path opposite to the super track "s" is the bad track "b". Both of the paths of the contiguous disk pattern 3' arranged along the axis $K_1$ are the good tracks "g". This feature is due to a peculiarity of bubble propagation which is caused by the cubic anisotropy of garnet film.

Figure 4:
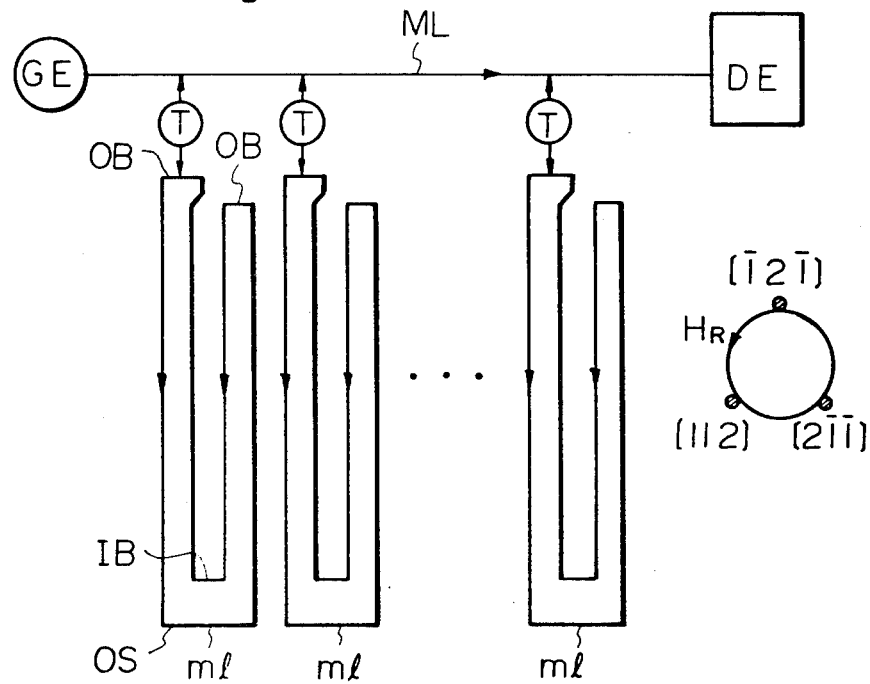
FIG. 4 illustrates a construction of the ion-implanted bubble device employing a folded minor loop organization.
Figure 5:
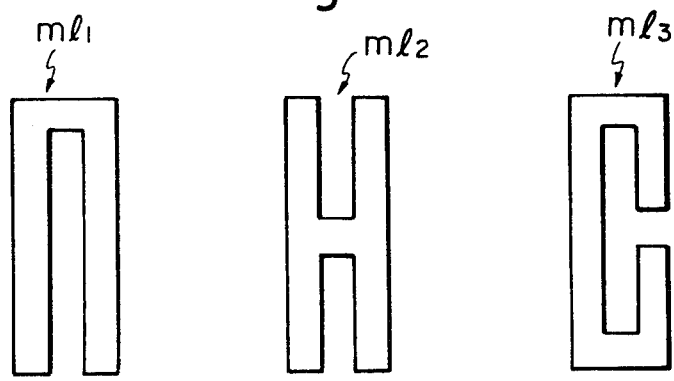
FIG. 5 illustrates different shapes of the folded minor loop.

FIG. 4 illustrates the construction of the major-minor loop organized ion-implanted bubble memory device adopting the folded minor loop. Reference symbol GE designates a bubble generator, DE a bubble detector, ML a major line, ml a minor loop, and T a bidirectional transfer gate. The minor loop ml is U-folded back in parallel to one $(\bar{1} 2 \bar{1})$ of the easy axes of striping out, i.e., in the direction of the good track, and has four 180° turns, namely, two outside turns OB along the bad track, an outside turn OS along the super track and an inside turn IB along the bad track. It should be understood that folded minor loops as illustrated in FIG. 5 are also useful. A minor loop $ml_1$ is inverse U-shaped and has four turns inclusive of an inside turn. A minor loop $ml_2$ is H-shaped and has six turns inclusive of two inside turns. A minor loop $ml_3$ is C-shaped and has six turns inclusive of two inside turns. Thus, the folded minor loops must have at least one 180° inside turn.

FIG. 6 illustrates an embodiment of the conventional 180° turn of the bubble propagation path. The inside turn of this propagation path presents a curve too gentle to realize a higher density. FIG. 7 illustrates a pattern so designed that the inside turn has the minimum dimension. However, such a pattern has a problem that a bubble (not shown) propagated from a tip A to a cusp B and then to a cusp C by means of a counterclockwise rotating field returns back to the cusp B as the rotating field continues to rotate, finally resulting in oscillation of the bubble between the cusps B and C.

The present invention is made to eliminate the above-mentioned problems in conventional devices. The preferred embodiments of the present invention will now be described with reference to FIGS. 8 through 24.

FIG. 8 illustrates a 180° turn of the bubble propagation path according to the present invention. Reference numeral 15 designates a bubble propagation pattern composed of a nonimplanted region and having an inside turn of the bubble propagation pattern along its bad track. This inside turn is provided with a substantially V-shaped cusp 6. Tips 10 and 11 are formed between the cusp 6 and the cusps 8 and 9, respectively, so that the summits of the cusps 8 and 9 cannot be linearly seen through from the summit of the cusp 6 (FIG. 7 corresponds to the case wherein said summits of the cusps 8 and 9 can be linearly seen through from the summit of the cusp 6). The summit of the cusp 6 is arranged a little toward a direction P of bubble propagation with respect to a center line CL of the cusp 6. The cusp center line CL is a line passing the mid-point of the line connecting the tips 10 and 11 and extending in parallel to the easy axis $(\bar{1} 2 1)$ of striping out. The deviation of the cusp summit is based on the fact that the "nearer the side along which the bubble is transferred out from the cusp to the vertical to the easy axis of striping out, the better the margin is", as reported by C. C. Shir(IBM) in J.A.P. 52(3) 2 388(1981). To realize such deviation, the present invention provides an arrangement that the side along which the bubble is transferred from the cusp 6 is inclined by 90° to 140° with respect to the easy axis of stripping out. When a rotating field $H_R$ rotates counterclockwise and the bubble is propagated in the direction of the arrow P as shown, an angle $\theta$ of the side 7 along which the bubble is transferred out with respect to the easy axis $(2 \bar{1} \bar{1})$ of striping out are 90° is 140° as measured counterclockwise around the cusp summit. When the field $H_R$ rotates clockwise and the bubble is propagated in the direction opposite to that indicated by the arrow P, on the other hand, an angle $\theta'$ of the side 7' of bubble transfer-out (the cusp summit deviates rightward with respect to the cusp center line CL, in this case) with respect to the easy axis $(\bar{1} \bar{1} 2)$ of striping out is 90° to 140° as measured clockwise. Said angles $\theta$ and $\theta'$ are between $-30°$ to $+20°$ when measured from the easy axis $(\bar{1} 2 \bar{1})$ of striping out.

Figure 9:
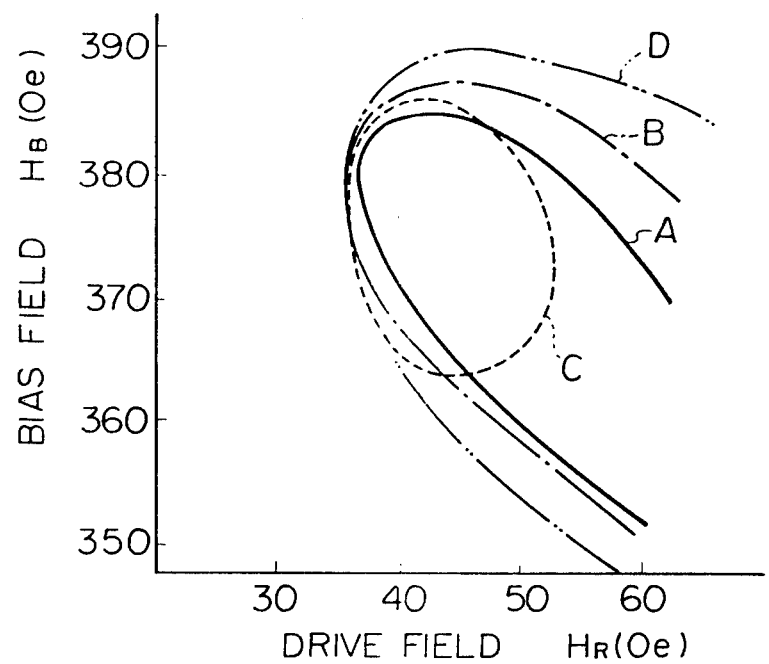
FIGS. 9 and 10 illustrate the performance characteristics of the embodiment shown by FIG. 8.

FIG. 9 is a diagram illustrating the relationship between the bias field $H_B$ and the driving field $H_R$ which was experimentally determined by varying said angle $\theta$ in FIG. 8. Referring to FIG. 9, a curve A corresponds to a case of $\theta = 140°$, a curve B corresponds to a case of $\theta = 120°$, a curve D corresponds to a case of $\theta = 90°$, and a curve C corresponds to a case wherein the cusp summit is placed on the cusp center line. It will be obvious that the angle $\theta = 90°$ to 140° established according to the present invention effectively enlarges the margin relative to said case wherein the cusp summit is placed just on the cusp center line.

Figure 10:
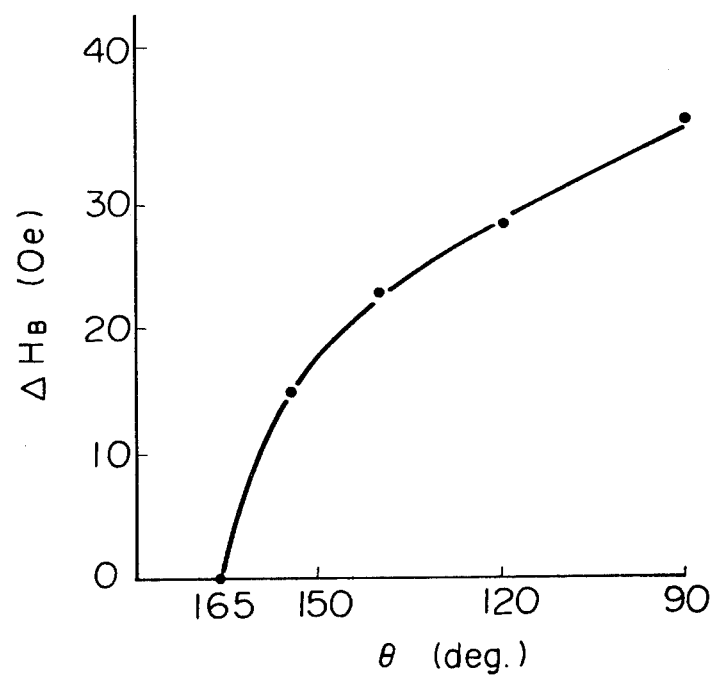

FIG. 10 is a diagram illustrating the relationship established between the angle and the bias margin $H_B$ when the driving field $H_R = 50$ Oe. It will be seen that the margin is enlarged as the angle $\theta$ decreases toward 90°, i.e., the side of bubble transfer-out approaches the vertical to the easy axis of striping out. As the angle $\theta$ decreases from 90°, the pattern formation becomes difficult from the viewpoint of the photolithographic technique and at the same time said side of bubble transfer-out deviates again off the direction normal to the easy axis of striping out. Accordingly, the angle lies preferably between 90° and 140°.

Figure 11:
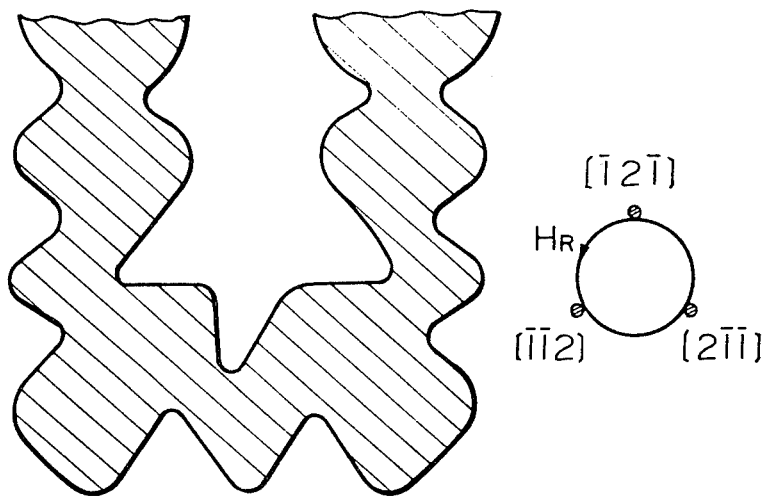
FIG. 11 illustrates a variation of the embodiment shown by FIG. 8.

FIG. 11 illustrates a variation of the embodiment shown by FIG. 8. This variation is different from the embodiment of FIG. 8 in that all the corners of the pattern are formed as curves but provides the same effect as in the case of the embodiment shown by FIG. 8.

Figure 12:
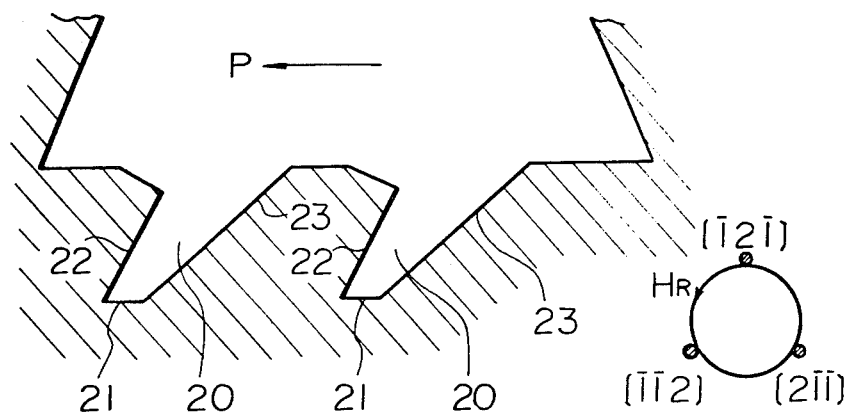
FIG. 12 illustrates another embodiment of the present invention.
Figure 13:
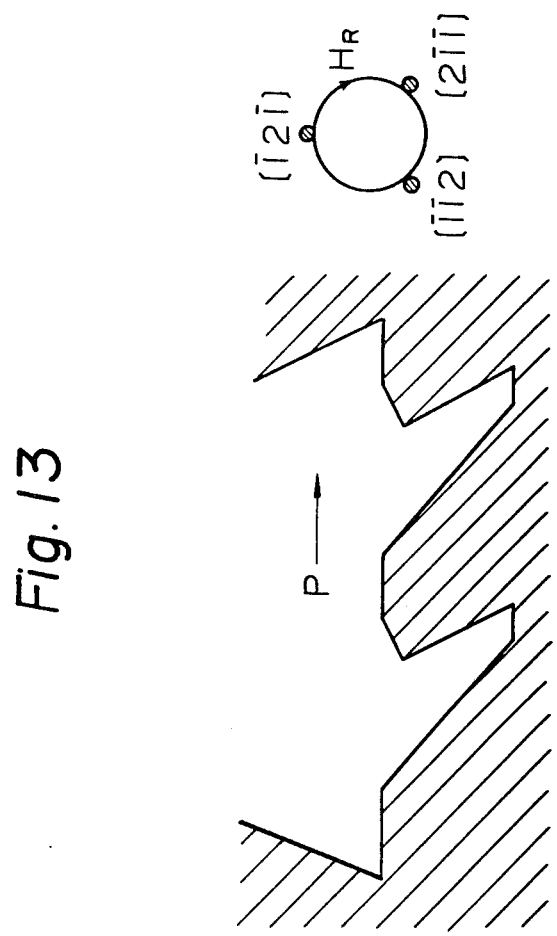
FIG. 13 illustrates a variation of the embodiment shown by FIG. 12.
Figure 14:
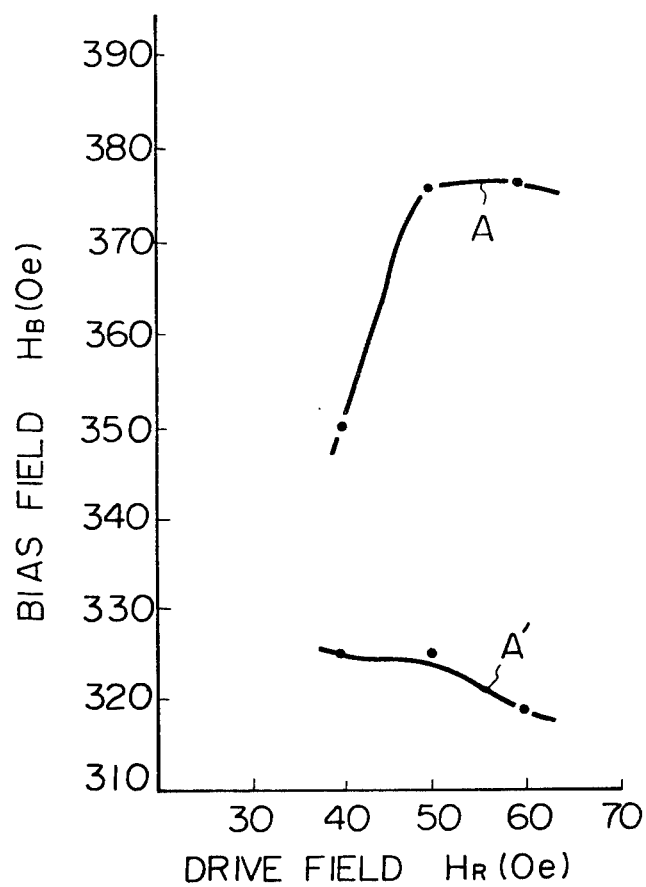
FIG. 14 illustrates the performance characteristics of the embodiment shown by FIG. 12 or FIG. 13.

FIG. 12 illustrates another embodiment of the 180° inside turn along the bad track according to the present invention, which has two cusps 20. The summit 20 of each cusp 20 is formed as a horizontal side to facilitate the pattern formation but deviates toward the direction P of bubble propagation with respect to the cusp center line (not shown). A side 22 along which the bubble is transferred out is substantially normal to the easy axis (2 $\bar{1}\bar{1}$) of striping out. A side 23 along which the bubble is transferred in is so arranged that the cusp has an opening angle sufficient to assure a preferable margin and said side 23 is rather smoothly connected to the neighboring side of the cusp. A pattern established when the bubble is propagated in the direction opposed to that in the case of FIG. 12 is illustrated by FIG. 13. This pattern is just the reverse to the pattern illustrated by FIG. 12. FIG. 14 illustrates the performance characteristics of the propagation path illustrated by FIG. 12 or FIG. 13 (bias-driving magnetic margin at a frequency of 1 Hz) and indicates that a large margin is assured.

Figure 15:
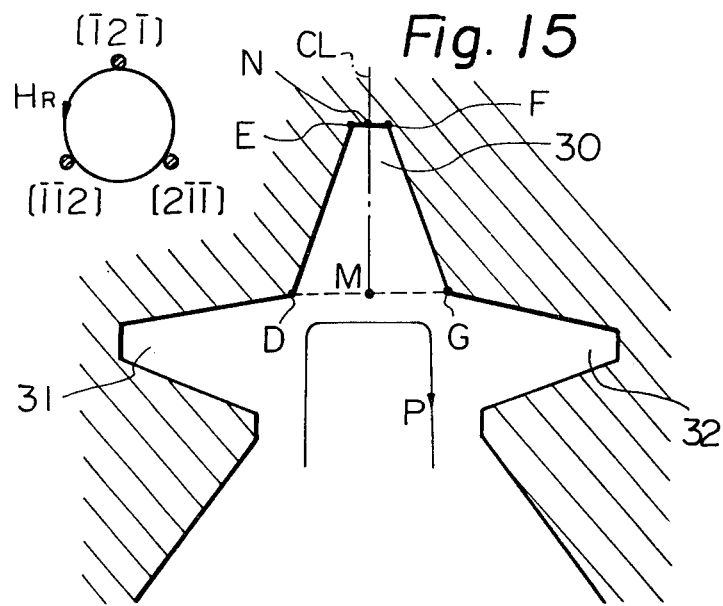
FIG. 15 illustrates a preferred embodiment of the inside turn of the bubble propagation path.

The 180° inside turn of the propagation path formed along the super track of the propagation pattern will now be described. FIG. 15 illustrates an embodiment of such an inside turn. This inside turn has a substantially V-shaped cusp 30 and the tips D and G formed between this cusp 30 and neighboring cusps 31 and 32 on the bubble transfer-in side and on the bubble transfer-out-side, respectively. The summits of the cusps neighboring each other cannot be linearly seen through from each other. A cusp center line CL passing mid-point on the line connecting the tips D and G and extending in parallel to the easy axis ($\bar{1}$ 2 $\bar{1}$) of striping out passes a middle point of a side EF which defines the cusp summit. Thus, the summit of the cusp 30 lies on the cusp center line and has no deviation toward the direction of bubble propagation. This is true also for the cusps 31 and 32 which neighbor said cusp 30.

Figure 16:
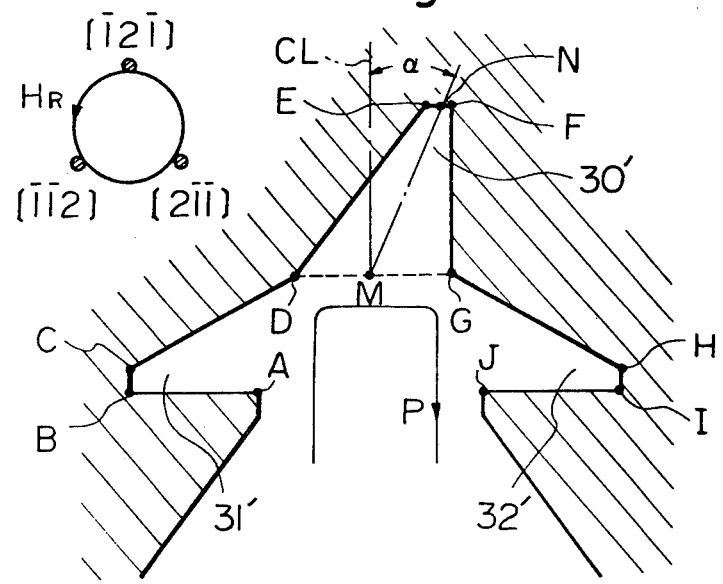
FIG. 16 illustrates an embodiment of the inside turn of the bubble propagation path according to the present invention.

FIG. 16 illustrates a variation of the embodiment illustrated by FIG. 15. In this embodiment, a mid-point N on the side EF of the cusp 30' deviates from the cusp center line CL toward the direction P of bubble propagation, and a line connecting the points M and N is inclined clockwise by an angle α with respect to the cusp center line. The neighboring cusps 31' and 32' also deviate away from and or toward the direction P of bubble propagation, and respectively sides AB and IJ are substantially normal to the easy axis ($\bar{1}$ 2 $\bar{1}$) of striping out, while sides CD and GH are substantially normal to the easy axes (2 $\bar{1}$ 1) and ($\bar{1}$ $\bar{1}$ 2) of striping out, respectively.

Figure 17:
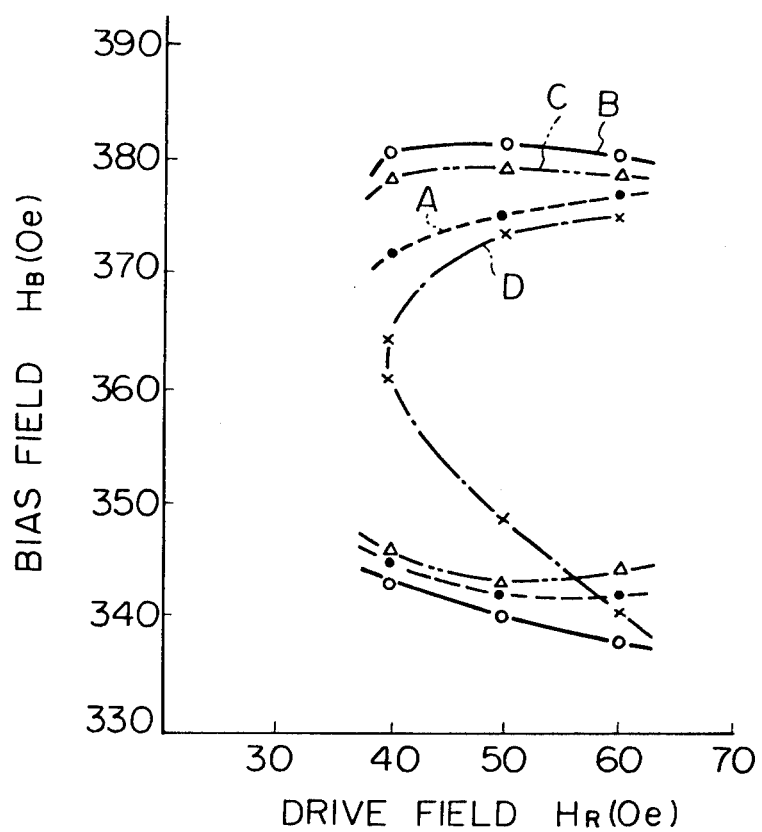
FIGS. 17 and 18 illustrate the performance characterics of the embodiment shown by FIG. 16.
Figure 18:
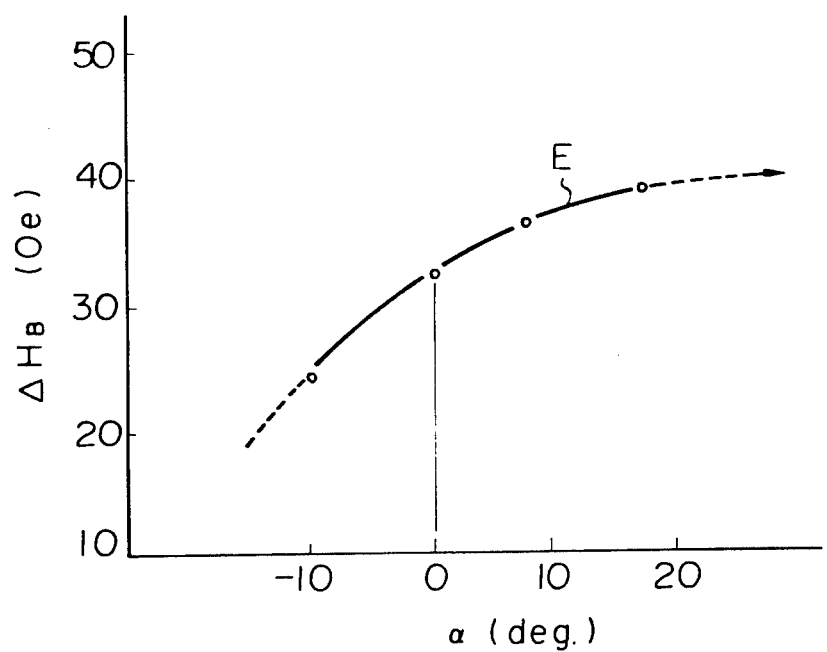

FIG. 17 illustrates the performance characteristics of the embodiment illustrated by FIG. 16, in which curves A, B, C and D correspond to the cases of α=0°, 17°, 8° and −10°, respectively. Curve E in FIG. 18 represents the dependency of the margin upon the angle α. Referring to FIG. 18, α=0° corresponds to the case wherein the cusp has no deviation as illustrated in FIG. 15, α>0 corresponds to the case wherein the cusp deviates toward the direction of bubble propagation, and α>0 corresponds to the case wherein the cusp deviates off the direction of bubble propagation. It will be apparent from FIGS. 17 and 18 that a preferably large margin can be obtained when α=5° to 17°.

Figure 19:
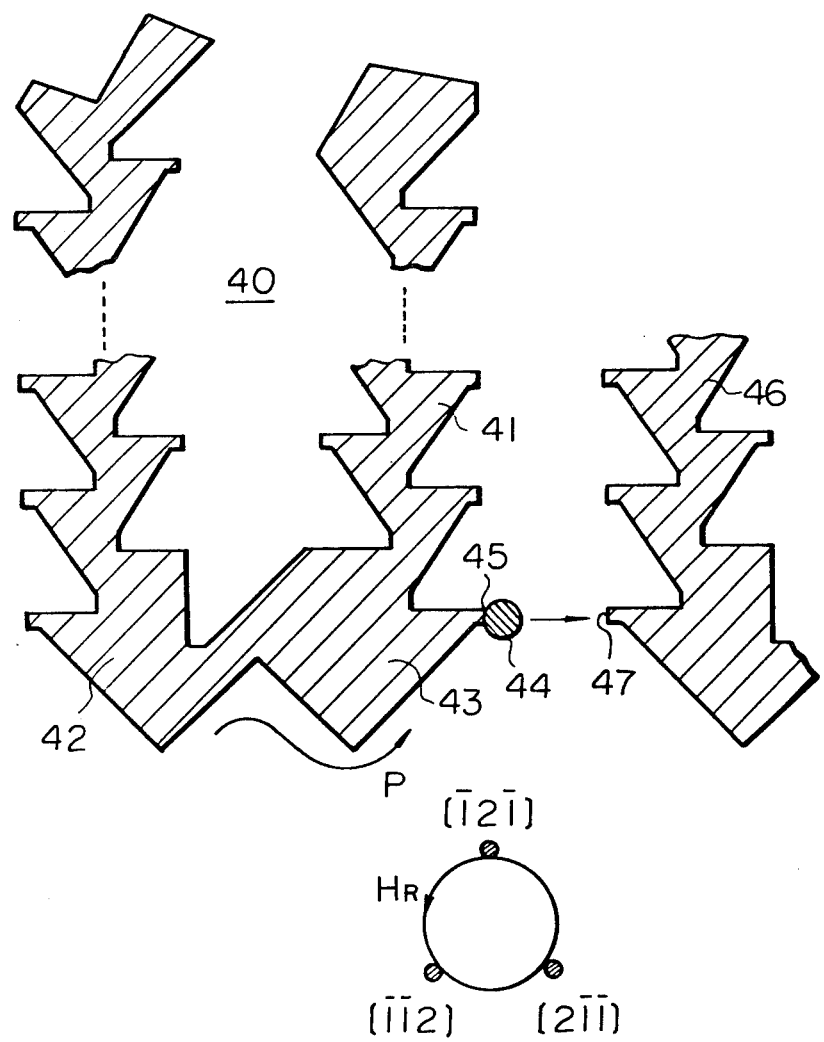
FIG. 19 illustrates another embodiment of the present invention.

FIG. 19 illustrates a U-folded minor loop pattern of the ion-implanted bubble device according to the present invention. Referring to FIG. 19, reference numeral 40 designates an ion-implanted region while reference numeral 41 designates a minor loop pattern defined by a nonimplanted region, i.e., a hatched area. The super track side and the bad track side in the folded portion of the pattern 41 are formed with the outside turn and the inside turn of the minor loop, respectively. In such a pattern, it is forced by a geometric requirement of its formation that the folded portion of the pattern should include relatively large regions 42 and 43, and, for example, a bubble 44 propagating along the outside turn as shown by an arrow P is sometimes erroneously transferred from a tip 45 to a tip 47 of a neighboring minor loop 46.

Another embodiment of the present invention made to solve this problem will be described in reference with FIG. 20. In the embodiment illustrated by FIG. 20, a pattern 51 is similar to the pattern 41 in FIG. 19 except that ion-implanted regions 52 and 53 are formed in the folded portion. The region 52 is independent of the bubble path around the pattern 51. The other region 53 is connected by a gap 54, which is similarly formed by an ion-implanted region, to the outside turn cusp. However, the gap 54 has a width substantially equal to the bubble diameter, so that no bubble can enter the region 53. The gap 54 contributes to reduction of any nucleation current during bubble transfer.

Figure 20:
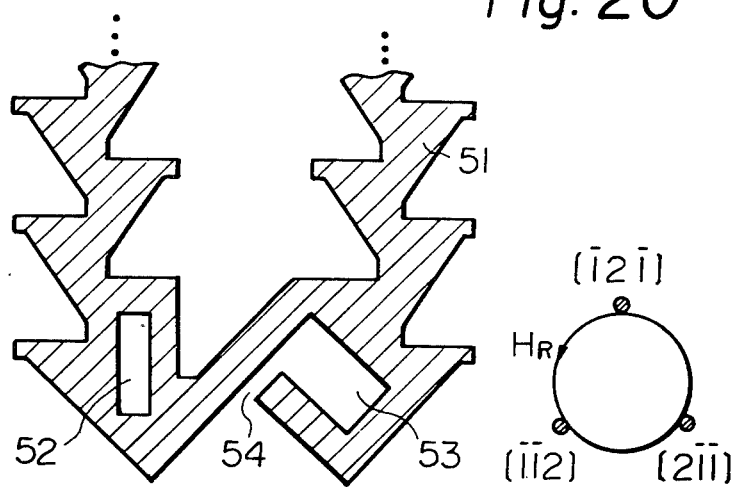
FIG. 20 illustrates still another embodiment of the present invention.
Figure 21:
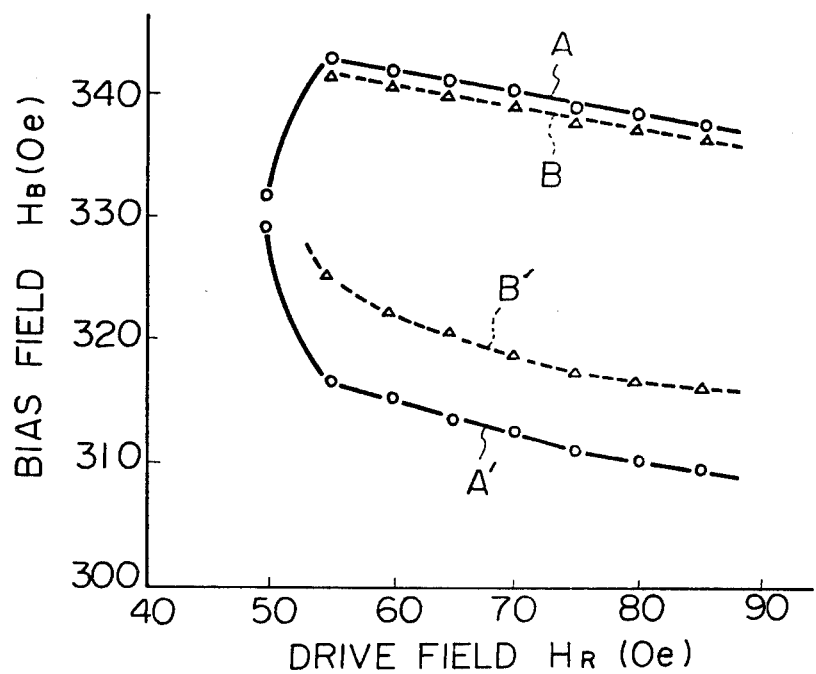
FIG. 21 illustrates the performance characteristics of the embodiments shown by FIGS. 19 and 20.

FIG. 21 illustrates the performance characteristics of the outside turn in the embodiment shown by FIGS. 19 and 20, by curves B, B' and curves A, A', respectively. In the embodiment of FIG. 20, the erroneous operation as above-mentioned is avoided by the presence of the ion-implanted regions 52 and 53, and the lower limit (curve A') of the bias field is improved approximately by 6 Oe relative to the bias field lower limit (curve B') in the embodiment shown by FIG. 19.

Figure 22:
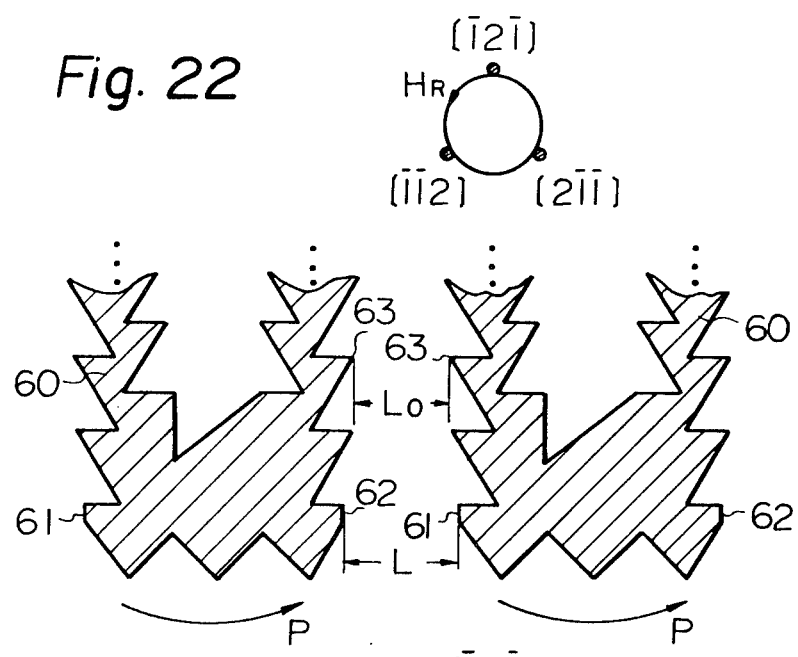
FIG. 22 illustrates another embodiment of the present invention.
Figure 23:
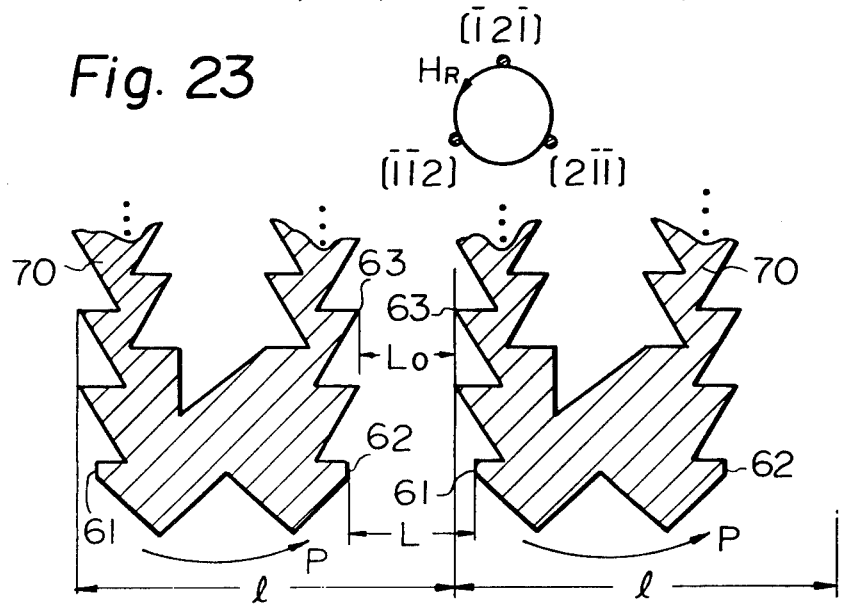
FIG. 23 illustrates a variation of the embodiment shown by FIG. 22.
Figure 24:
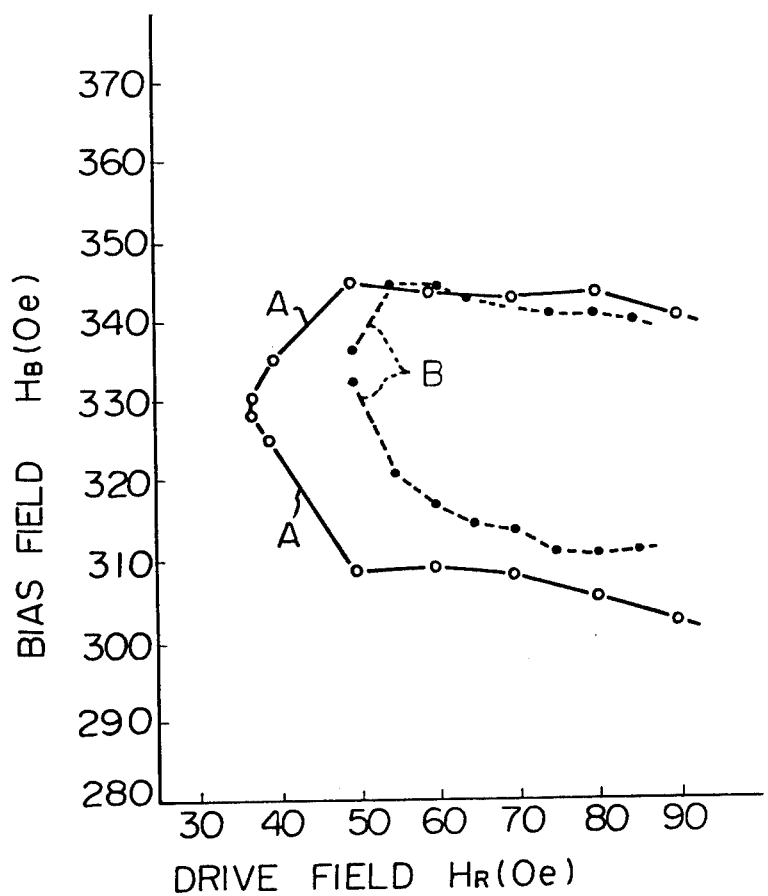
FIG. 24 illustrates the performance characteristics of the embodiments shown by FIGS. 22 and 23.

FIG. 22 illustrates still another embodiment of the present invention, which is also made to avoid the above-mentioned erroneous operation, and FIG. 23 illustrates a variation of this embodiment. Referring to FIGS. 22 and 23, the minor loop patterns 60 and 70 are similar to each other except that the outside turn of the pattern 60 includes two cusps while the outside turn of the pattern 70 includes a single cusp. The outside turns of the patterns 60 and 70 respectively have along opposite sides tips 61 and 62 which are lower than the other tips 63 at least by the bubble diameter so that a distance L between the tips 61 and 62 of neighboring patterns is longer, at least by a bubble diameter, than a distance $L_0$ between the other tips 63. It is also possible to achieve the desired distance L by forming only one of said tips 61 and 62 as a tip lower than the other tips 63. Such pattern formation reduces the previously mentioned erroneous transfer of bubbles to the neighboring pattern and improves the performance characteristics, since the distance L between the tips is adequately long. The performance characteristics are illustrated by FIG. 24, in which a curve A corresponds to the case of l=20 μm, $L_0$=5 μm and L=$L_0$+3 μm=8 μm in the embodiment of FIG. 23, and a curve B corresponds to the case of l=20 μm and $L_0$=L=5 μm also in the embodiment of FIG. 23. The diagram indicates noticeably improved lower limits of the bias field and of the driving field.

As will be obviously understood from the aforegoing description, the present invention permits a folded minor loop organization of good performance characteristics and of higher density and, therefore, an ion-implanted bubble device of higher density and of small size can be realized.

What is claimed is:

1. An ion-implanted bubble device comprising a magnetic layer in which magnetic bubbles are movable, said magnetic layer being selectively ion-implanted to provide bubble propagation patterns corresponding to regions of the magnetic layer which are not ion-implanted, so as to define bubble propagation paths including super, good and bad tracks in said magnetic layer with axes of easy stripe out parallel to respective ones of said good tracks around the bubble propagation patterns, wherein each of said bubble propagation paths has a plurality of substantially U-shaped turns and is folded back along the direction of a respective good track which is, in turn, parallel to a respective easy axis of stripe out in the magnetic layer, said substantially U-shaped turns of each said bubble propagation path include at least one inside turn, said at least one inside turn of each said bubble propagation path including at least one turn cusp which is substantially V-shaped, wherein tips are provided between said each said turn cusp and the neighboring cusps on the bubble transfer-in side and on the bubble transfer-out side, respectively, the summits of each said turn cusp and said neighboring cusps being arranged so that each said summit cannot be seen through from the neighboring cusp, and the summit of said at least one turn cusp deviates toward the direction of bubble propagation with respect to a center line of the respective turn cusp extending in parallel to a respective easy axis of stripe out and passing through the mid-point of a line connecting the tips of the respective turn cusp.

2. An ion-implanted bubble device according to claim 1, wherein said at least one inside turn of at least one of said bubble propagation paths is formed along a respective one of said bad tracks, and the bubble transfer-out side of said at least one turn cusp is inclined with respect to a respective easy axis of stripe out by an angle of 30° to 20°, measured counter-clockwise or clockwise around the summit of the respective turn cusp depending on the direction of bubble propagation.

3. An ion-implanted bubble device according to claim 1, wherein said at least one inside turn of the at least one of said bubble propagation paths is formed along a super track, with respect to said easy axis of stripe out of the bubble propagation pattern, and a line connecting the summit of the respective turn cusp and said mid-point of said line connecting the respective tips extends at an angle of 5° to 17° with respect to said center line of the respective turn cusp, measured clockwise or counter-clockwise depending on the direction of bubble propagation.

4. An ion-implanted bubble device according to claim 1, 2 or 3, wherein the respective non-implanted region of the bubble propagation pattern of at least one of said substantially U-shaped turns includes at least one further ion-implanted region that is practically independent of the bubble propagation paths.

5. An ion-implanted bubble device according to claim 1, 2 or 3, wherein said substantially U-shaped turns of each said bubble propagation path include a plurality of outside turns formed along respective super tracks of the respective bubble propagation pattern, and each of said outside turns includes a plurality of tips at least one of which is lower than the tips formed along the other portions of the bubble propagation path by at least a bubble diameter, so that the distance between the tips at the beginning of said outside turns of mutually neighboring bubble propagation paths is longer than the distance between the tips of the other portions of said mutually neighboring bubble propagation paths.

* * * * *

UNITED STATES PATENT AND TRADEMARK OFFICE
CERTIFICATE OF CORRECTION

PATENT NO. : 4,462,087
DATED : July 24, 1984
INVENTOR(S) : Satoh et al.

It is certified that error appears in the above-identified patent and that said Letters Patent is hereby corrected as shown below:

Front Page [73], "Kawsaki" should be --Kawasaki-Shi--.

ABSTRACT [57], line 1, "Ion" should be --An ion--;
line 6, "cusp center line." should be --center line of the cusp.--.

Col. 1, line 34, "shaped." should be --shape.--;
line 58, "cups" should be --cusps--;

Col. 2, line 40, "ics" should be --istics--.

Col 5, line 9, "20" (2nd occurr.) should be --21--;
line 56, "(2 $\bar{1}$ 1)" should be --(2 $\bar{1}$ $\bar{1}$)--.

Col. 6, line 63, "1=20" should be --$\ell$=20--;
line 66, "1=20" should be --$\ell$=20--.

Col. 7, line 1, "aforegoing" should be --foregoing--.

Signed and Sealed this

Sixteenth Day of August, 1988

Attest:

DONALD J. QUIGG

Attesting Officer      Commissioner of Patents and Trademarks